US012689350B2

(12) United States Patent
Daimon

(10) Patent No.: US 12,689,350 B2
(45) Date of Patent: Jul. 21, 2026

(54) ACOUSTIC WAVE DEVICE

(71) Applicant: Murata Manufacturing Co., Ltd.,
Nagaokakyo (JP)

(72) Inventor: Katsuya Daimon, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 118 days.

(21) Appl. No.: 18/762,153

(22) Filed: Jul. 2, 2024

(65) Prior Publication Data

US 2024/0356517 A1 Oct. 24, 2024

Related U.S. Application Data

(63) Continuation of application No.
PCT/JP2023/000610, filed on Jan. 12, 2023.

(60) Provisional application No. 63/299,214, filed on Jan.
13, 2022.

(51) Int. Cl.
*H03H 9/02* (2006.01)
*H03H 9/13* (2006.01)

(52) U.S. Cl.
CPC .... *H03H 9/02228* (2013.01); *H03H 9/02015*
(2013.01); *H03H 9/02086* (2013.01); *H03H*
*9/132* (2013.01)

(58) Field of Classification Search
CPC ........... H03H 9/02228; H03H 9/02015; H03H
9/02086; H03H 9/132; H03H 9/02559;
H03H 9/02574; H03H 9/145; H03H 9/25
USPC .................................. 333/187, 188, 193–196
See application file for complete search history.

(56) References Cited

U.S. PATENT DOCUMENTS

| 10,491,192 B1 | 11/2019 | Plesski et al. |
| 2017/0250671 A1 | 8/2017 | Omura et al. |
| 2019/0386638 A1 | 12/2019 | Kimura et al. |
| 2021/0167756 A1 | 6/2021 | Yantchev et al. |

(Continued)

FOREIGN PATENT DOCUMENTS

| WO | 2016098526 A1 | 6/2016 |
| WO | 2018163860 A1 | 9/2018 |

OTHER PUBLICATIONS

International Search Report in PCT/JP2023/000610, mailed Mar. 28, 2023, 3 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a piezoelectric substrate including a support including a support substrate and a piezoelectric layer on the support and made of lithium tantalate or lithium niobate, and an IDT electrode on the piezoelectric layer and including busbars and electrode fingers. d/p is less than or equal to about 0.5. Some electrode fingers are connected to one busbar. Remaining electrode fingers are connected to another busbar. A crossing region includes a central region and edge regions in an electrode-finger-extending direction. A non-support portion of the support overlaps the central region and about 90% or more of a portion of the edge regions located between the electrode fingers. A through-hole is provided in about 50% or more of the piezoelectric layer overlapping gap regions and located between the electrode fingers. The support portion overlaps a portion of the gap regions where the electrode fingers are provided.

19 Claims, 14 Drawing Sheets

(56)          References Cited

U.S. PATENT DOCUMENTS

2022/0060168 A1*    2/2022  Yantchev  ...........  H03H 9/02102
2023/0275564 A1*    8/2023  Ouchi  ...............  H03H 9/02007
                                                    310/313 B

OTHER PUBLICATIONS

Written Opinion in PCT/JP2023/000610, mailed Mar. 28, 2023, 3
pages.

* cited by examiner

ACOUSTIC WAVE DEVICE

CROSS REFERENCE TO RELATED APPLICATIONS

This application claims the benefit of priority to Provisional Application No. 63/299,214 filed on Jan. 13, 2022 and is a Continuation Application of PCT Application No. PCT/JP2023/000610 filed on Jan. 12, 2023. The entire contents of each application are hereby incorporated herein by reference.

BACKGROUND OF THE INVENTION

1. Field of the Invention

The present invention relates to acoustic wave devices.

2. Description of the Related Art

To date, acoustic wave devices have been widely used for filters of mobile phones and the like. In recent years, an acoustic wave device that uses a thickness-shear-mode bulk wave, such as the one described in U.S. Pat. No. 10,491,192, has been proposed. In the acoustic wave device, a piezoelectric layer is provided on a supporter. A pair of electrodes are provided on the piezoelectric layer. The pair of electrodes face each other on the piezoelectric layer and are connected to potentials that differ from each other. A thickness-shear-mode bulk wave is excited by applying an alternate-current voltage between the electrodes.

In the acoustic wave device described in U.S. Pat. No. 10,491,192, it is difficult to sufficiently reduce or prevent loss. For example, it may be possible to reduce or prevent worsening of loss by not using the supporter to support the electrodes for exciting an acoustic wave. In this case, however, strength becomes insufficient, and thus breakage of the piezoelectric layer or the like might occur.

SUMMARY OF THE INVENTION

Example embodiments of the present invention provide acoustic wave devices that are each able to reduce or prevent worsening of loss without making the acoustic wave device fragile.

An acoustic wave device according to an example embodiment of the present invention includes a piezoelectric substrate including a support that includes a support substrate and a piezoelectric layer on the support and made of lithium tantalate or lithium niobate, and an IDT electrode on the piezoelectric layer and including a pair of busbars and a plurality of electrode fingers. d/p is less than or equal to about 0.5, where d is a thickness of the piezoelectric layer and p is a center-to-center distance between the electrode fingers that are adjacent to each other. Some electrode fingers of the plurality of electrode fingers are connected to one of the pair of busbars, remaining electrode fingers of the plurality of electrode fingers are connected to another of the pair of busbars, and the some electrode fingers connected to the one of the busbars and the remaining electrode fingers connected to the another of the pair of busbars are inter-digitated with each other. When seen from an electrode-finger-facing direction in which adjacent electrode fingers of the plurality of electrode fingers face each other, a region in which the adjacent electrode fingers overlap each other is a crossing region, regions that are located between the crossing region and the pair of busbars are a pair of gap regions, and the crossing region includes a central region and a pair of edge regions positioned with the central region therebetween in an electrode-finger-extending direction in which the plurality of electrode fingers extend. The support includes a support portion that supports the piezoelectric layer and a non-support portion that does not support the piezoelectric layer. The non-support portion of the support overlaps, in plan view, the central region and about 90% or more of a portion of the pair of edge regions that is located between the electrode fingers. When seen in plan view, a through-hole is provided in the piezoelectric layer in about 50% or more of a portion that overlaps the pair of gap regions and that is located between the electrode fingers. In plan view, the support portion of the support overlaps a portion of the pair of gap regions where the electrode fingers are provided.

With example embodiments of the present invention, acoustic wave devices are provided that each reduce or prevent worsening of loss without making the acoustic wave device fragile.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereafter, the present invention will be clarified by describing example embodiments of the present invention with reference to the drawings.

Each example embodiment described in the present description are examples and it is possible to partially replace or combine configurations between different example embodiments.

Figure 1:
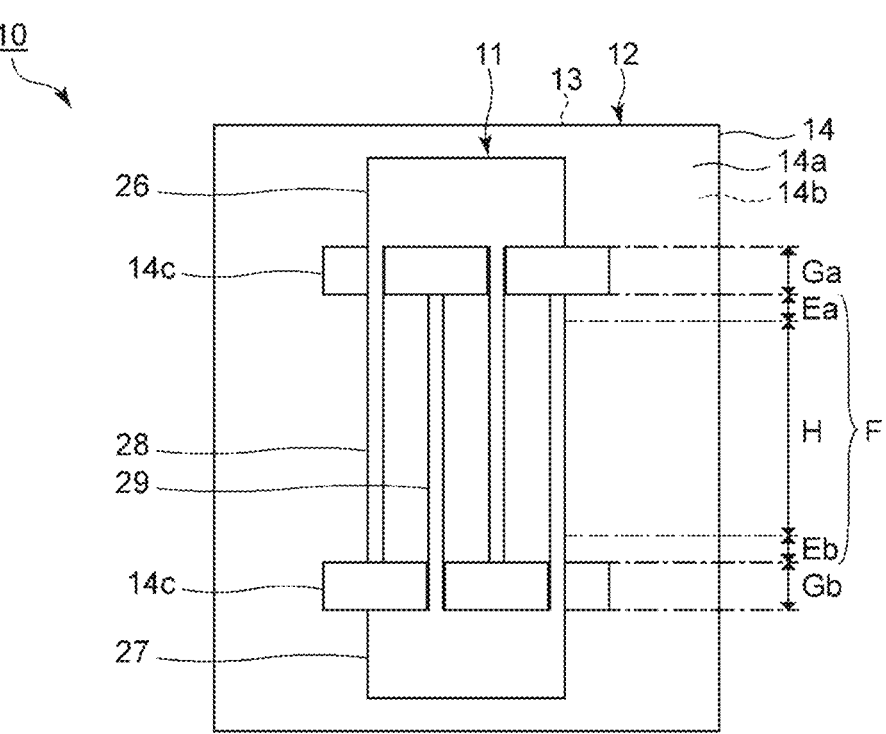
FIG. 1 is a schematic plan view of an acoustic wave device according to a first example embodiment of the present invention.

FIG. 1 is a schematic plan view of an acoustic wave device according to a first example embodiment of the present invention.

An acoustic wave device 10 includes a piezoelectric substrate 12 and an IDT electrode 11. The piezoelectric substrate 12 includes a support 13 and a piezoelectric layer 14. The piezoelectric layer 14 is provided on the support 13.

The piezoelectric layer 14 includes a first main surface 14a and a second main surface 14b. The first main surface 14a and the second main surface 14b face each other. The second main surface 14b is located on the support 13 side. The IDT electrode 11 is provided on the first main surface 14a of the piezoelectric layer 14.

The IDT electrode 11 includes a pair of busbars and a plurality of electrode fingers. The pair of busbars include a first busbar 26 and a second busbar 27. The first busbar 26 and the second busbar 27 face each other. The plurality of electrode fingers include a plurality of first electrode fingers 28 and a plurality of second electrode fingers 29. One end of each of the plurality of first electrode fingers 28 is connected to the first busbar 26. One end of each of the plurality of second electrode fingers 29 is connected to the second busbar 27. The plurality of first electrode fingers 28 and the plurality of second electrode fingers 29 are interdigitated with each other. The IDT electrode 11 may include a single-layer metal film or may include a multilayer metal film.

Hereafter, the first electrode finger 28 and the second electrode finger 29 each may be simply referred to as an electrode finger. When an electrode-finger-extending direction is defined as a direction in which a plurality of electrode fingers extend and an electrode-finger-facing direction is defined as a direction in which adjacent electrode fingers face each other, the electrode-finger-extending direction and the electrode-finger-facing direction are perpendicular or substantially perpendicular to each other in the present example embodiment.

A region in which adjacent electrode fingers overlap each other when seen from the electrode-finger-facing direction is a crossing region F. The crossing region F includes a central region H and a pair of edge regions. The pair of edge regions are disposed so as to face each other with the central region H therebetween in the electrode-finger-extending direction.

The pair of edge regions include a first edge region Ea and a second edge region Eb. The first edge region Ea is located on the first busbar 26 side. The second edge region Eb is located on the second busbar 27 side.

Regions that are located between the crossing region F and the pair of busbars are a pair of gap regions. The pair of gap regions include a first gap region Ga and a second gap region Gb. The first gap region Ga is located between the first busbar 26 and the first edge region Ea. The second gap region Gb is located between the second busbar 27 and the second edge region Eb.

Figure 2:
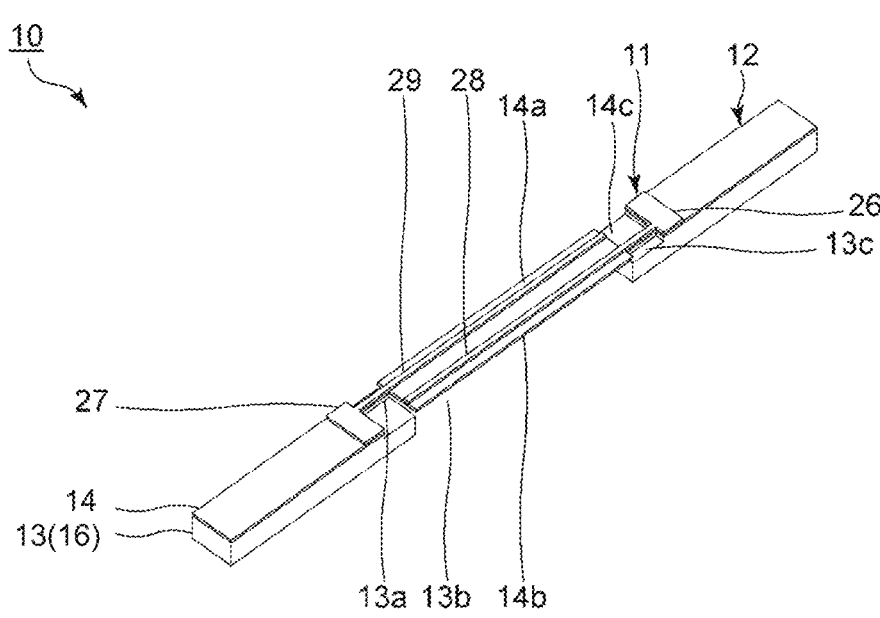
FIG. 2 is a schematic perspective view illustrating a portion in the vicinity of a pair of electrode fingers of the acoustic wave device according to the first example embodiment of the present invention.
Figure 3:
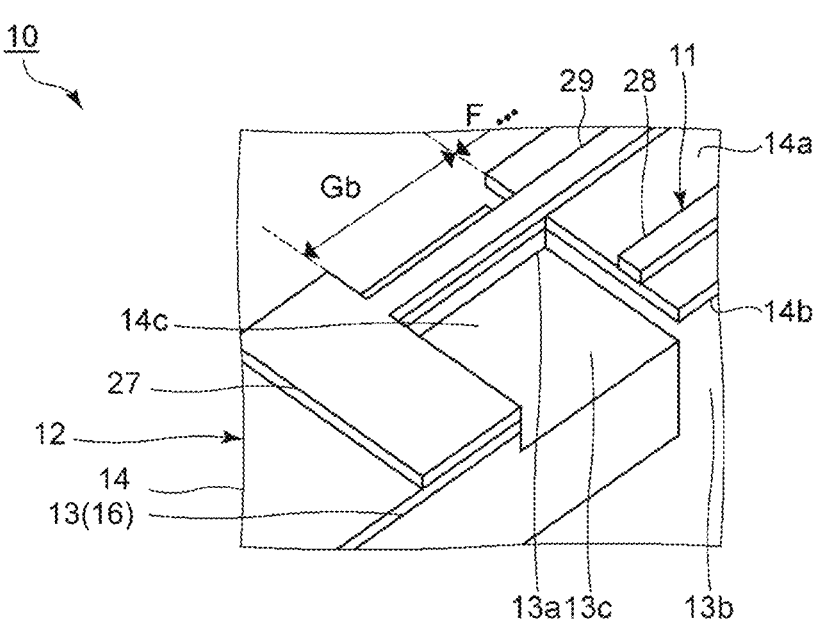
FIG. 3 is a schematic perspective view in which a portion of FIG. 2 is enlarged.

FIG. 2 is a schematic perspective view illustrating a portion in the vicinity of a pair of electrode fingers of the acoustic wave device according to the first example embodiment. FIG. 3 is a schematic perspective view in which a portion of FIG. 2 is enlarged.

As illustrated in FIGS. 2 and 3, in the present example embodiment, the support 13 includes only a support substrate 16. Thus, the piezoelectric layer 14 is provided directly on the support substrate 16. The support 13 may include the support substrate 16 and an insulating layer. In this case, for example, it is sufficient that the insulating layer is provided between the support substrate 16 and the piezoelectric layer 14.

As the material of the support substrate 16, for example, it is possible to use a semiconductor such as silicon, ceramics such as aluminum oxide, or the like. The piezoelectric layer 14 is, for example, a lithium niobate layer such as a $LiNbO_3$ layer or a lithium tantalate layer such as a $LiTaO_3$ layer.

The support 13 includes a support portion 13a and a non-support portion 13b. The support portion 13a is a portion that supports the piezoelectric layer 14. The non-support portion 13b is a portion that does not support the piezoelectric layer 14. In plan view, the support portion 13a overlaps the entirety or substantially the entirety of a portion where the first busbar 26 is provided and the entirety or substantially the entirety of a portion where the second busbar 27 is provided. The support portion 13a also overlaps a portion of the first gap region Ga where electrode fingers are provided and a portion of the second gap region Gb where electrode fingers are provided. On the other hand, the support portion 13a does not overlap the first edge region Ea and the second edge region Eb in plan view. In the present description, "in plan view" means viewing from the upper side in FIG. 2 in the stacking direction in which the support 13 and the piezoelectric layer 14 are stacked. In FIG. 2, for example, the upper side is the piezoelectric layer 14 side, between the support substrate 16 side and the piezoelectric layer 14 side.

On the other hand, the non-support portion 13b overlaps the entirety or substantially the entirety of the first edge region Ea, the second edge region Eb, and the central region H in plan view. However, it is sufficient that the non-support portion 13b overlaps, in plan view, the central region H and, for example, about 90% or more of a portion of the first edge region Ea and the second edge region Eb that is located between electrode fingers. In the present example embodiment, the non-support portion 13b is defined by providing a through-hole in the support 13. The non-support portion 13b may be defined by providing a recessed portion in the support 13.

As illustrated in FIG. 1, a plurality of through-holes 14c are provided in the piezoelectric layer 14. To be more specific, some through-holes 14c, among all of the through-holes 14c, are each provided in the entirety or substantially the entirety of a portion that overlaps the first gap region Ga in plan view and that is located between electrode fingers. That is, in the first gap region Ga, the piezoelectric layer 14 is provided only in a portion where electrode fingers are provided.

The remaining through-holes 14c are each provided in the entirety or substantially the entirety of a portion that overlaps the second gap region Gb in plan view and that is located between electrode fingers. In the second gap region Gb, the piezoelectric layer 14 is provided only in a portion where electrode fingers are provided.

It is sufficient that, in plan view, each through-hole 14c of the piezoelectric layer 14 is provided in, for example, about 50% or more of a portion that overlaps the first gap region Ga or the second gap region Gb and that is located between electrode fingers. When a portion of the piezoelectric layer 14 where the through-hole 14c is provided is less than 100% of a portion that is located between electrode fingers, the piezoelectric layer 14 is provided in the vicinity of a portion that overlaps the first electrode finger 28 or the second electrode finger 29 in plan view. That is, in plan view, the piezoelectric layer 14 is provided so as to extend in a direction perpendicular or substantially perpendicular to the electrode-finger-extending direction from a portion where the first electrode finger 28 or the second electrode finger 29 is provided.

The acoustic wave device 10 according to the present example embodiment is an acoustic wave resonator that is configured to be capable of using a thickness-shear-mode bulk wave. To be more specific, in the acoustic wave device 10, d/p is, for example, less than or equal to 0.5, where d is the thickness of the piezoelectric layer 14 and p is the center-to-center distance between adjacent electrode fingers. Thus, a thickness-shear-mode bulk wave is appropriately excited. An excitation region is a region where adjacent electrode fingers overlap when seen in the electrode-finger-facing direction and that is located between the centers of adjacent electrode fingers. In each excitation region, a thickness-shear-mode bulk wave is excited.

The present example embodiment includes the following configurations 1) to 3). 1) The non-support portion 13b of the support 13 overlaps, in plan view, the central region H and about 90% or more of a portion of the pair of edge regions that is located between electrode fingers. 2) When seen in plan view, the through-hole 14c is provided in the piezoelectric layer 14 in about 50% or more of a portion that overlaps the pair of gap regions and that is located between electrode fingers. 3) In plan view, the support portion 13a of the support 13 is provided so as to overlap a portion of the pair of gap regions where electrode fingers are provided. Thus, it is possible to reduce or prevent worsening of loss without making the acoustic wave device fragile. Details of this advantageous effect will be described below by comparing the present example embodiment with a first comparative example and a second comparative example.

The first comparative example differs from the first example embodiment in that the through-hole 14c is not provided in the piezoelectric layer 14. That is, in the first comparative example, the piezoelectric layer 14 is provided in the entirety of a portion that overlaps each gap region when seen in plan view. The acoustic wave device 10 having the configuration of the first example embodiment and an acoustic wave device of the first comparative example are prepared, and the admittance frequency characteristics of each of the devices are measured.

Figure 4:
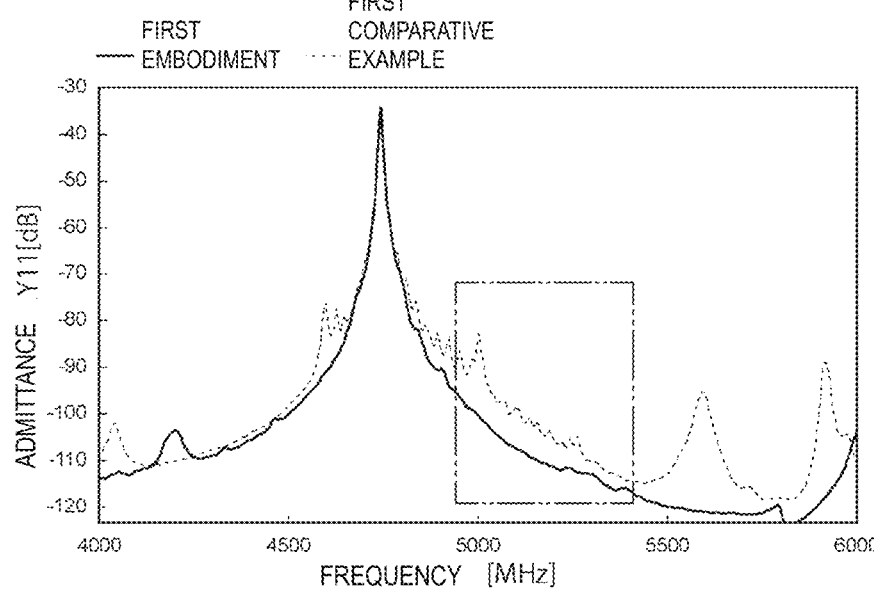
FIG. 4 is a graph illustrating the admittance frequency characteristics of the first example embodiment of the present invention and a first comparative example.

FIG. 4 is a graph illustrating the admittance frequency characteristics of the first example embodiment and the first comparative example. When the admittance in the vicinity of a frequency band surrounded by a two-dot chain line in FIG. 4 is small, loss of the acoustic wave resonator is small. The same applies to the other graphs representing the admittance frequency characteristics.

As illustrated in FIG. 4, it can be seen that the loss in the first example embodiment is less than that in the first comparative example. This is because a plurality of through-holes 14c are provided in the piezoelectric layer 14 in the first example embodiment illustrated in FIG. 1. In each gap region, the piezoelectric layer 14 is not provided in a portion other than the portion where electrode fingers are provided. Thus, it is possible to reduce or prevent leakage of an acoustic wave due to propagation of the acoustic wave through the piezoelectric layer 14.

In addition, the non-support portion 13b of the support 13 overlaps, in plan view, the central region H and about 90% or more of a portion of the pair of edge regions that is located between electrode fingers. Thus, it is possible to increase the excitation efficiency of an acoustic wave. Accordingly, with the first example embodiment, it is possible to reduce or prevent worsening of loss.

The piezoelectric layer 14 may be provided, in each gap region, in the vicinity of a portion where an electrode finger is provided. As described above, it is sufficient that the through-hole 14c be provided in the piezoelectric layer 14 in about 50% or more of a portion that is located between electrode fingers. Also in this case, it is possible to reduce or prevent worsening of loss.

Next, comparison between the first example embodiment and the second comparative example will be described. The second comparative example differs from the first example embodiment in that the second comparative example does not include the support portion 13a. Strain analysis is performed on the acoustic wave device 10 having the configuration of the first example embodiment and an acoustic wave device of the second comparative example.

Figure 5:
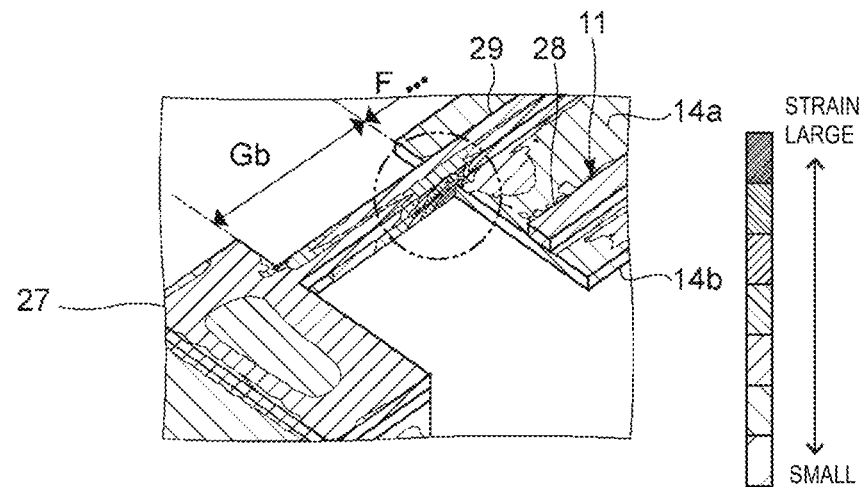
FIG. 5 illustrates the result of strain analysis of an acoustic wave device of a second comparative example.
Figure 6:
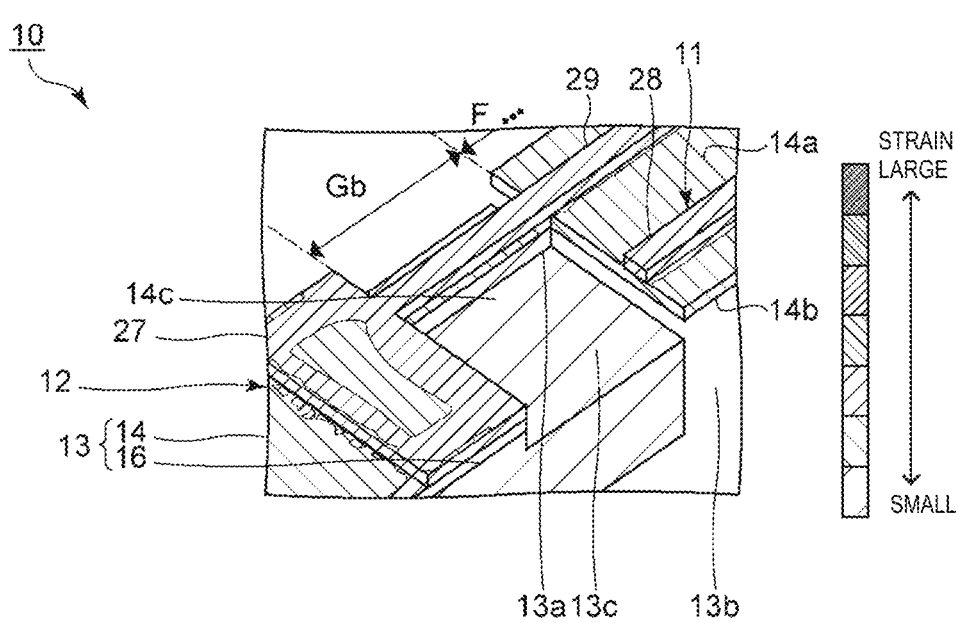
FIG. 6 illustrates the result of strain analysis of the acoustic wave device according to the first example embodiment of the present invention.

FIG. 5 illustrates the result of strain analysis of the acoustic wave device of the second comparative example. FIG. 6 illustrates the result of strain analysis of the acoustic wave device according to the first example embodiment.

As shown in the two-dot-chain-line circle in FIG. 5, it can be seen that, in the second comparative example, strain is particularly large in the vicinity of the boundary between the crossing region F and the gap region. Therefore, a crack is easily generated in the piezoelectric layer 14 in the vicinity of the boundary. Otherwise, the electrode finger might break. Thus, in the second comparative example, the acoustic wave device breaks more easily.

In contrast, as illustrated in FIG. 6, it can be seen that, in the first example embodiment, strain is small in the vicinity of the boundary between the crossing region F and the gap region. This is because the support portion 13a of the support 13 is provided so as to overlap, in plan view, a portion of each gap region where an electrode finger is provided.

To be more specific, since the piezoelectric layer 14 is supported by the support portion 13a, it is possible to reinforce the piezoelectric layer 14 and the electrode finger in the gap region. Thus, it is possible to reduce strain in the vicinity of the boundary between the crossing region F and the gap region. Thus, a crack is not easily generated in the piezoelectric layer 14, and the electrode finger does not break easily. As described above, with the first example embodiment, it is possible to reduce or prevent worsening of loss without making the acoustic wave device fragile.

As illustrated in FIG. 3, in the support 13, a hole portion 13c that is integrated with the through-hole of the piezoelectric layer 14 is provided in a portion that overlaps the second gap region Gb when seen in plan view. In the present example embodiment, the hole portion 13c is a recessed portion. The hole portion 13c of the support 13 communicates with the non-support portion 13b. Similarly, in the support 13, a hole portion 13c that is integrated with the through-hole 14c of the piezoelectric layer 14 is provided in a portion that overlaps the first gap region Gb when seen in plan view.

The hole portion 13c of the support 13 may be a through-hole. However, it is preferable that the hole portion 13c of the support 13 is a recessed portion. Thus, it is possible to increase the strength of the support 13. Alternatively, the hole portion 13c of the support 13 need not be provided. It is sufficient that the through-hole 14c is provided in the piezoelectric layer 14 as described above.

A dielectric film may be provided on the first main surface 14a of the piezoelectric layer 14 so as to cover the IDT electrode 11. In this case, the IDT electrode 11 does not break easily, because the IDT electrode is protected by the dielectric film. For the dielectric film, it is possible to use, for example, silicon oxide, silicon nitride, silicon oxynitride, or the like.

Figure 7:
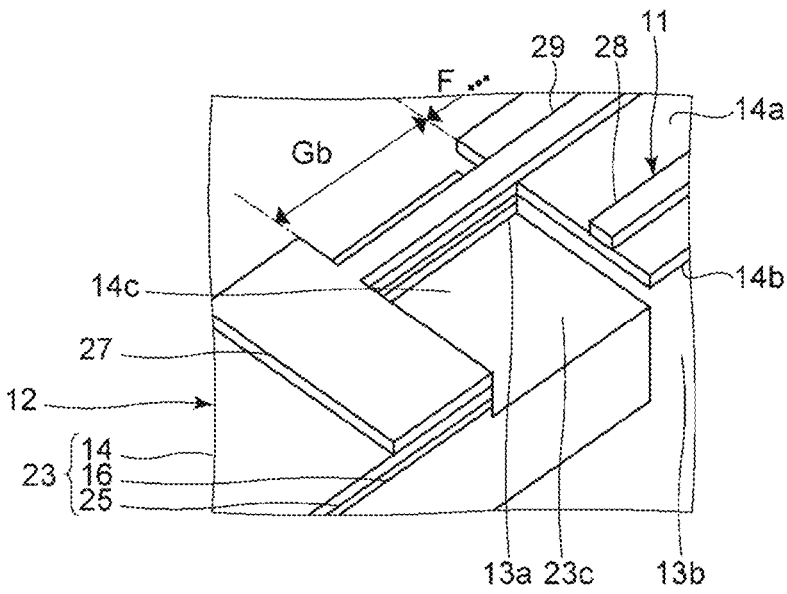
FIG. 7 is a schematic perspective view illustrating the vicinity of a second gap region of an acoustic wave device according to a modification of the first example embodiment of the present invention.

As described above, the support 13 may include the support substrate 16 and the insulating layer. In a modification of the first example embodiment illustrated in FIG. 7, a support 23 is a multilayer body including the support substrate 16 and an insulating layer 25. The piezoelectric layer 14 is provided on the insulating layer 25. In the present modification, a hole portion 23c of the support 23 includes a through-hole provided in the insulating layer 25. The through-hole and a recessed portion or a through-hole provided in the support substrate 16 define the hole portion 23c.

As the material of the insulating layer 25, it is possible to use any appropriate dielectric such as, for example, silicon oxide or tantalum oxide. Also with the present modification, as with the first example embodiment, it is possible to reduce or prevent worsening of loss without making the acoustic wave device fragile.

In the first example embodiment, the support portion 13a of the support 13 is not provided in a portion that overlaps each edge region in plan view. However, the support portion 13a may be provided in the portion. Examples of this will be described as second to fourth example embodiments of the present invention. Except for the configuration of the support portion 13a, acoustic wave devices according to the second to fourth example embodiments each have a configuration the same as or similar to that of the acoustic wave device 10 according to the first example embodiment. Also with the second to fourth example embodiments, as with the first example embodiment, it is possible to reduce or prevent worsening of loss without making the acoustic wave device fragile.

Figure 8:
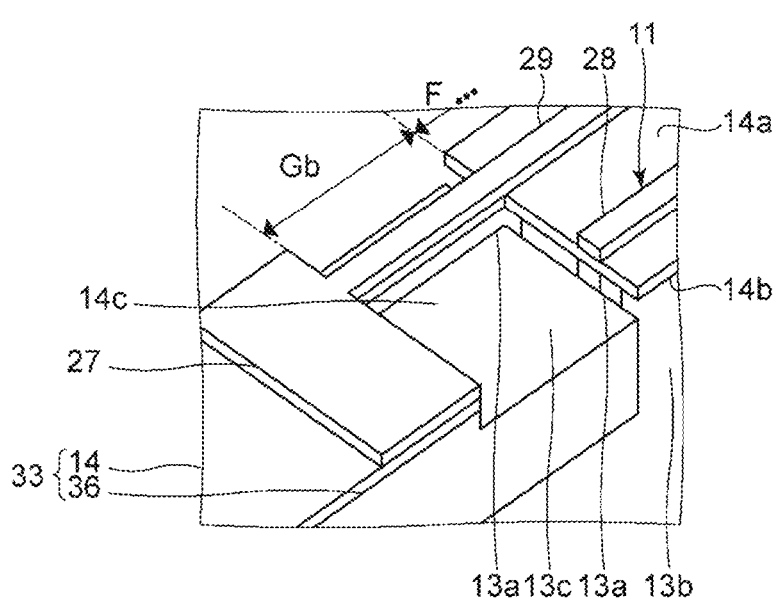
FIG. 8 is a schematic perspective view illustrating the vicinity of a second gap region of an acoustic wave device according to a second example embodiment of the present invention.

FIG. 8 is a schematic perspective view illustrating the vicinity of a second gap region of an acoustic wave device according to the second example embodiment.

In the second example embodiment, the support portion 13a of a support 33 overlaps, in plan view, both of a portion of the second edge region Eb where the first electrode finger 28 is provided and a portion of the second edge region Eb where the second electrode finger 29 is provided. To be more specific, the support portion 13a that overlaps a portion of the second edge region Eb where the second electrode finger 29 is provided in plan view is provided so as to extend from the support portion 13a that overlaps the second gap region Gb in plan view. The support portion 13a is a portion of a support substrate 36.

An end portion of the first electrode finger 28 is located in the second edge region Eb. Thus, the support portion 13a of a portion of the support 33 overlaps, in plan view, a portion of the second edge region Eb where the end portion of the first electrode finger 28 is provided.

In FIG. 8, a portion in the vicinity of a pair of electrode fingers is illustrated. However, the support portion 13a is provided at a plurality of positions so as to overlap, in plan view, a plurality of electrode fingers provided in the second edge region Eb. The support portion 13a does not overlap the other portion of the second edge region Eb in plan view.

Another support portion 13a of the support 33 overlaps, in plan view, both of a portion of the first edge region Ea where the first electrode finger 28 is provided and a portion of the first edge region Ea where the second electrode finger 29 is provided. The support portion 13a that overlaps a portion of the first edge region Ea where the first electrode finger 28 is provided in plan view is provided so as to extend from the support portion 13a that overlaps the first gap region Ga in plan view. The support portion 13a of a portion of the support 33 overlaps, in plan view, a portion of the first edge region Ea where an end portion of the second electrode finger 29 is provided. The support portion 13a does not overlap the other portion of the first edge region Ea in plan view.

In the second example embodiment, in plan view, the support portion 13a overlaps all of a portion of the first edge region Ea and the second edge region Eb where the first electrode finger 28 and the second electrode finger 29 are provided. It is sufficient that the support 33 include the support portion 13*a* at at least one position that overlaps, in plan view, a portion of the first edge region Ea and the second edge region Eb where the first electrode finger 28 and the second electrode finger 29 are provided.

The non-support portion 13*b* overlaps, in plan view, the entirety or substantially the entirety of a portion of the first edge region Ea and the second edge region Eb between electrode fingers. However, as described above, for example, it is sufficient that the non-support portion 13*b* overlap, in plan view, about 90% or more of a portion of the first edge region Ea and the second edge region Eb that is located between electrode fingers.

Thus, the non-support portion 13*b* need not overlap, in plan view, a portion of a portion of the first edge region Ea or the second edge region Eb between electrode fingers. In this case, the support portion 13*a* is provided in the vicinity of a portion that overlaps the first electrode finger 28 or the second electrode finger 29 in plan view. That is, in plan view, the support portion 13*a* is provided so as to extend in a direction perpendicular or substantially perpendicular to the electrode-finger-extending direction from the portion where the first electrode finger 28 or the second electrode finger 29 is provided. Also in this case, it is possible to reduce loss.

However, as in the second example embodiment, it is preferable that the non-support portion 13*b* overlap, in plan view, the entirety or substantially the entirety of a portion of the first edge region Ea and the second edge region Eb between electrode fingers. Thus, it is possible to effectively reduce loss.

Figure 9:
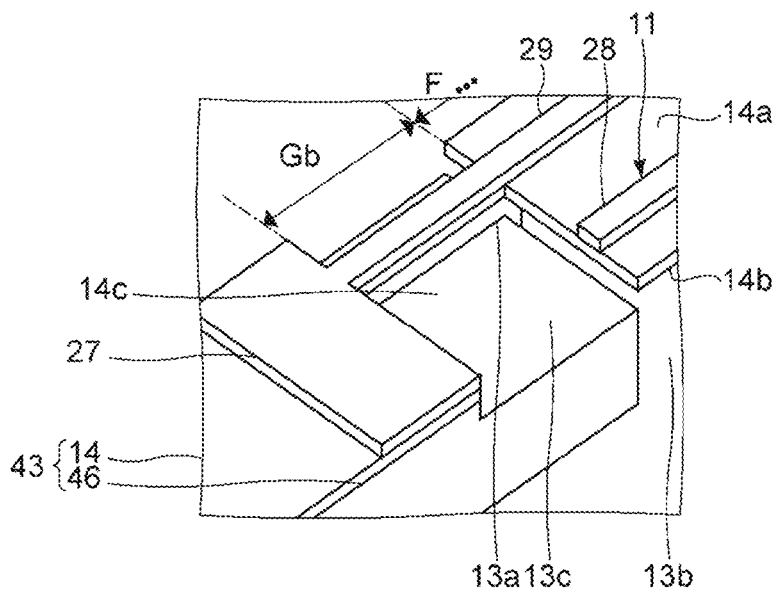
FIG. 9 is a schematic perspective view illustrating the vicinity of a second gap region of an acoustic wave device according to a third example embodiment of the present invention.

FIG. 9 is a schematic perspective view illustrating the vicinity of a second gap region of an acoustic wave device according to a third example embodiment of the present invention.

In the third example embodiment, the support portion 13*a* of a support 43 overlaps, in plan view, a portion of the second edge region Eb where one of electrode fingers is provided. To be specific, the support portion 13*a* overlaps, in plan view, a portion of the second edge region Eb where the second electrode finger 29 is provided. The support portion 13*a* is provided so as to extend from the support portion 13*a* that overlaps the second gap region Gb in plan view. The support portion 13*a* is a portion of a support substrate 46.

In FIG. 9, a pair of electrode fingers are illustrated. However, the support portion 13*a* is provided at a plurality of positions so as to overlap, in plan view, a plurality of second electrode fingers 29 that are provided in the second edge region Eb. The support portion 13*a* does not overlap the other portion of the second edge region Eb in plan view.

Another support portion 13*a* of the support 43 overlaps, in plan view, a portion of the first edge region Ea where the first electrode finger 28 is provided. The support portion 13*a* is provided so as to extend from the support portion 13*a* that overlaps the first gap region Ga in plan view. The support portion 13*a* is provided at a plurality of positions so as to overlap a plurality of first electrode fingers 28 in plan view. The support portion 13*a* does not overlap the other portion of the first edge region Ea in plan view.

Figure 10:
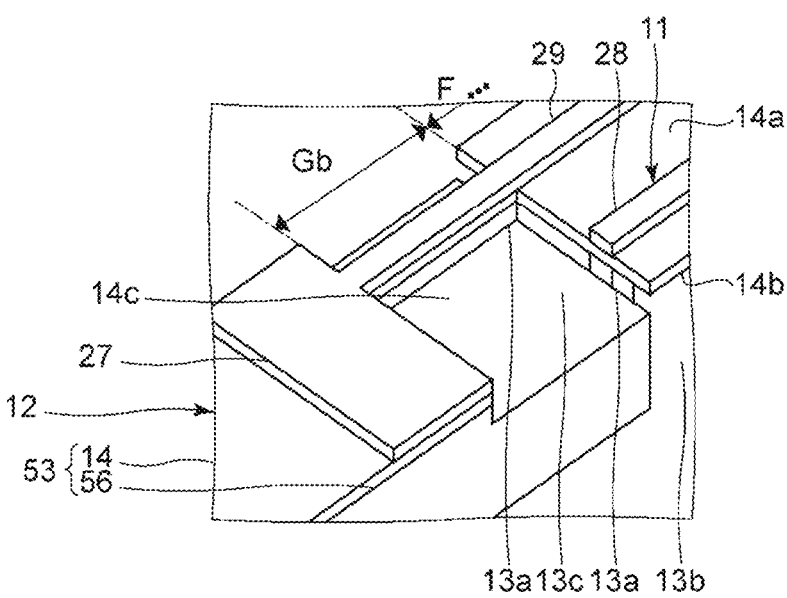
FIG. 10 is a schematic perspective view illustrating the vicinity of a second gap region of an acoustic wave device according to a fourth example embodiment of the present invention.

FIG. 10 is a schematic perspective view illustrating the vicinity of a second gap region of an acoustic wave device according to a fourth example embodiment of the present invention.

In the fourth example embodiment, the support portion 13*a* of a support 53 overlaps, in plan view, a portion of the second edge region Eb where one of electrode fingers is provided. To be specific, the support portion 13*a* overlaps, in plan view, a portion of the second edge region Eb where an end portion of the first electrode finger 28 is provided. The support portion 13*a* is a portion of a support substrate 56.

The support portion 13*a* is provided at a plurality of positions so as to overlap end portions of a plurality of first electrode fingers 28 in plan view. The support portion 13*a* does not overlap the other portion of the second edge region Eb in plan view.

Another support portion 13*a* of the support 53 overlaps, in plan view, a portion of the first edge region Ea where an end portion of the second electrode finger 29 is provided. The support portion 13*a* is provided at a plurality of positions so as to overlap end portions of a plurality of second electrode fingers 29 in plan view. The support portion 13*a* does not overlap the other portion of the first edge region Ea in plan view.

Figure 11:
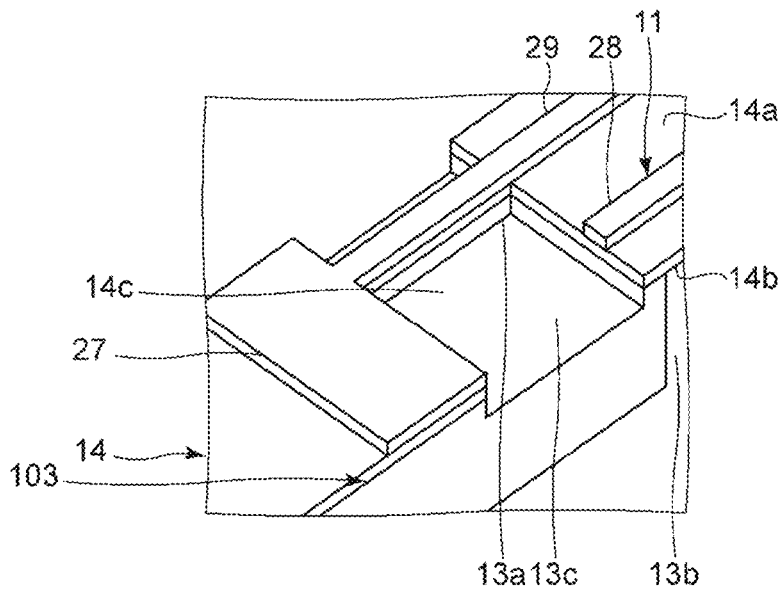
FIG. 11 is a schematic perspective view illustrating the vicinity of a second gap region of an acoustic wave device of a third comparative example.

Here, the admittance frequency characteristics of each of acoustic wave devices having the configuration of the second to fourth example embodiments and the acoustic wave device of a third comparative example are compared. As illustrated in FIG. 11, the third comparative example differs from the second to fourth example embodiments in that the support portion 13*a* of a support 103 overlaps all portions of the second edge region Eb in plan view. The third comparative example differs from the second to fourth example embodiments also in that the support portion 13*a* of the support 103 overlaps all portions of the first edge region Ea in plan view.

Figure 12:
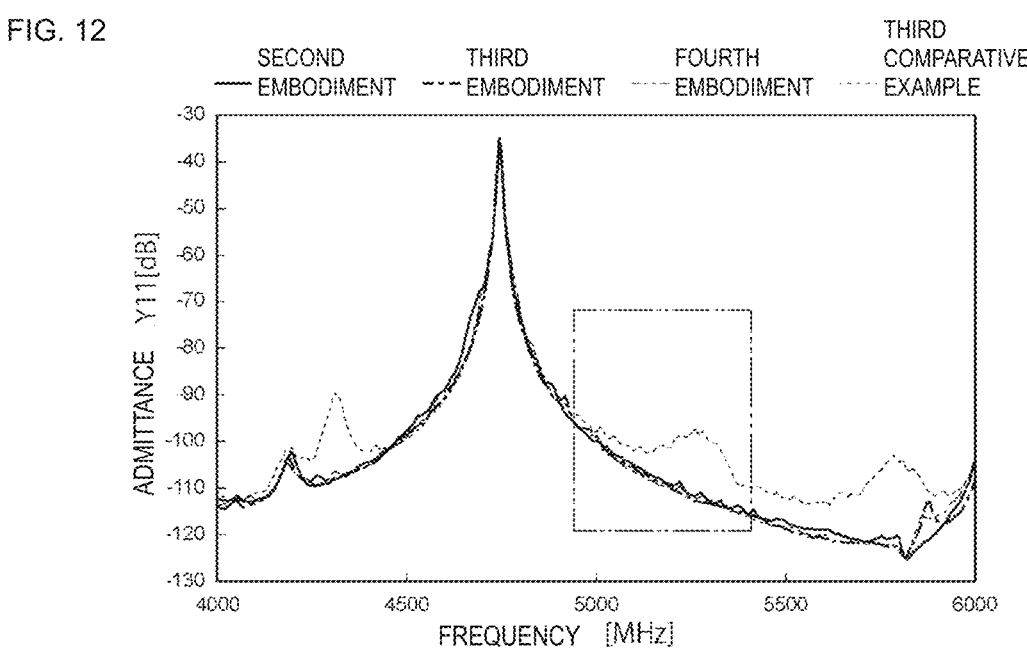
FIG. 12 is a graph illustrating the admittance frequency characteristics of the second to fourth example embodiments and the third comparative example.

FIG. 12 is a graph illustrating the admittance frequency characteristics of the second to fourth example embodiments and the third comparative example.

As illustrated in FIG. 12, it can be seen that, in any of the second to fourth example embodiments, worsening of loss is reduced or prevented further than in the third comparative example. This is because, in the second to fourth example embodiments, the non-support portion 13*b* overlaps, in plan view, about 90% or more of a portion of the first edge region Ea and the second edge region Eb that is located between electrode fingers.

Figure 13:
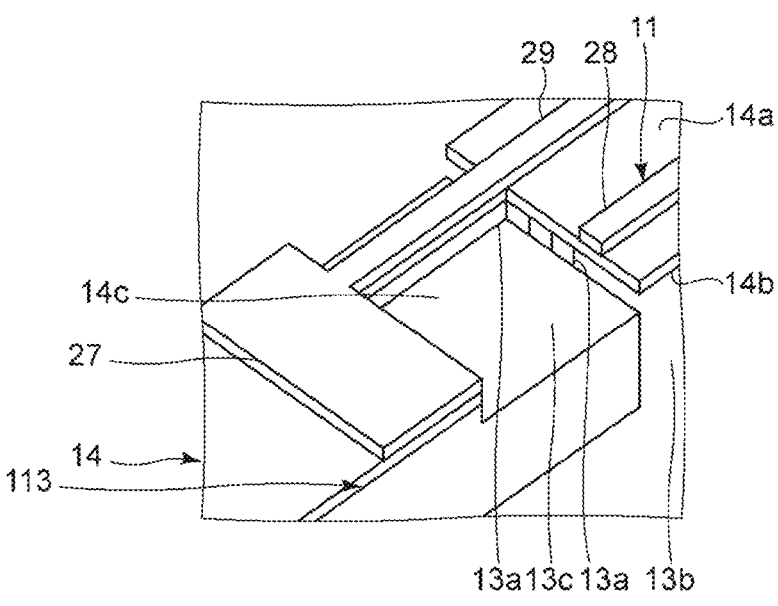
FIG. 13 is a schematic perspective view illustrating the vicinity of a second gap region of an acoustic wave device of a fourth comparative example.

Moreover, whether or not loss worsens depending on the position where the support portion 13*a* is provided was examined. To be specific, an acoustic wave device of a fourth comparative example, which differs from the third example embodiment only in the position of the support portion 13*a*, is prepared. As illustrated in FIG. 13, in the fourth comparative example, the support portion 13*a* of a support 113 overlaps, in plan view, the center between electrode fingers in the second edge region Eb. Similarly, the support portion 13*a* overlaps, in plan view, the center between electrode fingers in the first edge region Ea. The support portion 13*a* does not overlap, in plan view, a portion of the first edge region Ea and the second edge region Eb where electrode fingers are provided.

The area of a portion where the support portion 13*a* overlaps the edge region in plan view in the third example embodiment is the same or approximately the same as that in the fourth comparative example. The admittance frequency characteristics of an acoustic wave device having the configuration of the third example embodiment and an acoustic wave device of the fourth comparative example are compared. The admittance frequency characteristics of the third comparative example will be described together.

Figure 14:
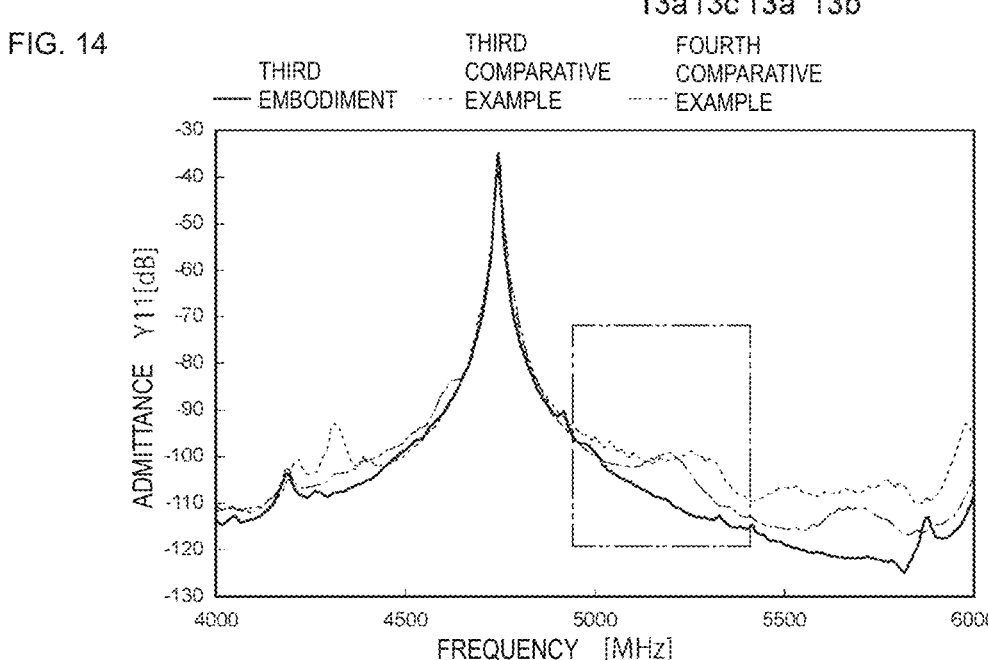
FIG. 14 is a graph illustrating the admittance frequency characteristics of the third example embodiment of the present invention, the third comparative example, and the fourth comparative example.

FIG. 14 is a graph illustrating the admittance frequency characteristics of the third example embodiment, the third comparative example, and the fourth comparative example.

As illustrated in FIG. 14, the degree of worsening of loss in the fourth comparative example is smaller than that in the third comparative example. However, worsening of loss is further reduce or prevented in the third example embodiment than in the fourth comparative example. Thus, it can be seen that the position of the support portion 13a is more influential in worsening of loss than the area of a portion where the support portion 13a overlaps the edge region in plan view.

In the third example embodiment, the support portion 13a overlaps an electrode finger in plan view. The excitation intensity of a thickness-shear-mode bulk wave is not high in a portion where an electrode finger is provided. Thus, excitation of a thickness-shear-mode bulk wave as an acoustic wave is not easily hindered by the presence of the support portion 13a. The non-support portion 13b overlaps, in plan view, about 90% or more of a portion of the first edge region Ea and the second edge region Eb that is located between electrode fingers. Thus, it is possible to reduce or prevent worsening of loss.

Moreover, strain analysis of each of acoustic wave devices having the configurations of the second example embodiment and the third example embodiment is performed.

Figure 15:
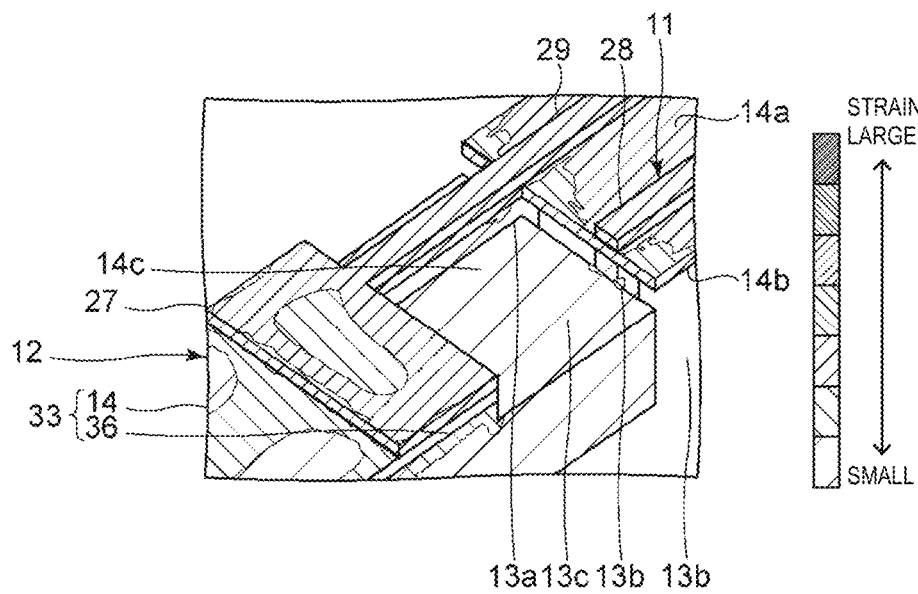
FIG. 15 illustrates the result of strain analysis of the acoustic wave device according to the second example embodiment of the present invention.
Figure 16:
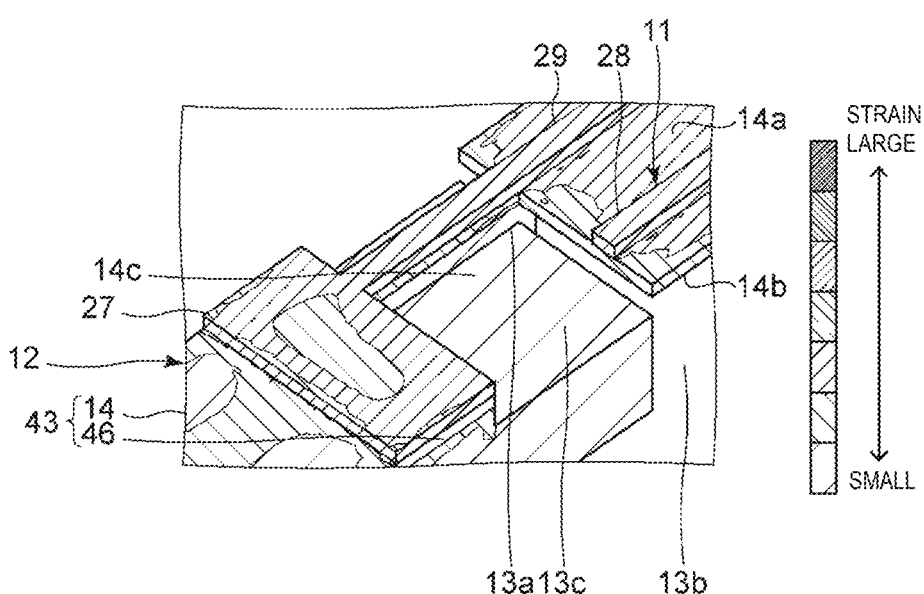
FIG. 16 illustrates the result of strain analysis of the acoustic wave device according to the third example embodiment of the present invention.

FIG. 15 illustrates the result of strain analysis of the acoustic wave device according to the second example embodiment. FIG. 16 illustrates the result of strain analysis of the acoustic wave device according to the third example embodiment.

As illustrated in FIG. 15, it can be seen that, in the second example embodiment, strain is small in the vicinity of the boundary between the crossing region F and the gap region. This is because, in plan view, the support portion 13a of the support 13 is provided so as to overlap a portion of each gap region where an electrode finger is provided. Moreover, the support portion 13a is provided so as to extend from the gap region under the electrode finger in the edge region.

To be more specific, in the second example embodiment, in both of the crossing region F and the gap region, the piezoelectric layer 14 and the electrode fingers can be reinforced by the support portion 13a. Thus, it is possible to reduce strain in the vicinity of the boundary between the crossing region F and the gap region. Thus, a crack is not easily generated in the piezoelectric layer 14 and the electrode finger does not break easily.

As illustrated in FIG. 16, also in the third example embodiment, as in the second example embodiment, it can be seen that strain in the vicinity of the boundary between the crossing region F and the gap region is small.

Hereafter, details of a thickness shear mode will be described. An "electrode" in an IDT electrode described below corresponds to an electrode finger. A support in the following example corresponds to a support substrate.

Figure 17A:
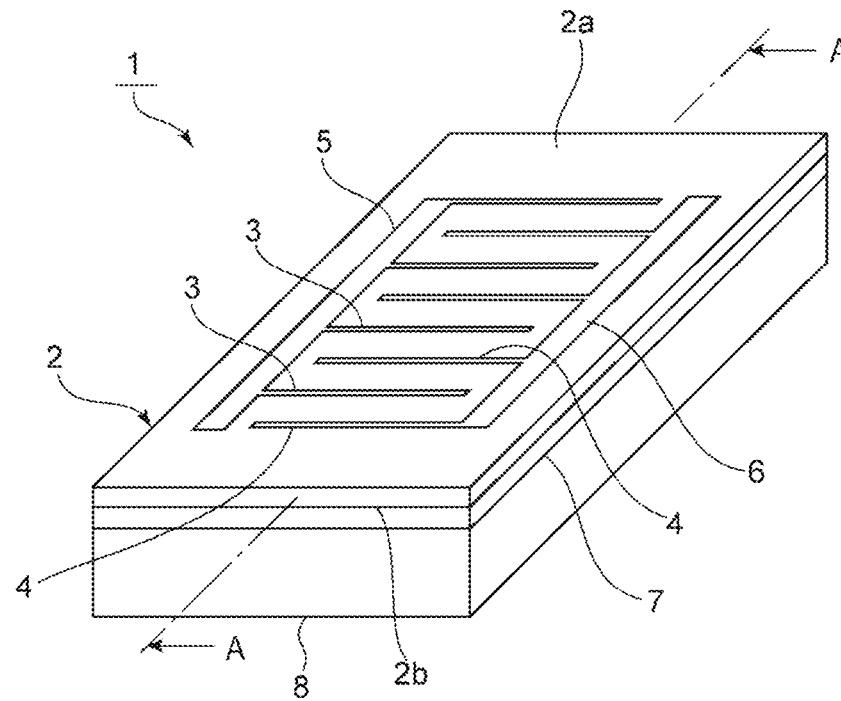
FIG. 17A is a schematic external perspective view of an acoustic wave device that uses a thickness-shear-mode bulk wave.
Figure 17B:
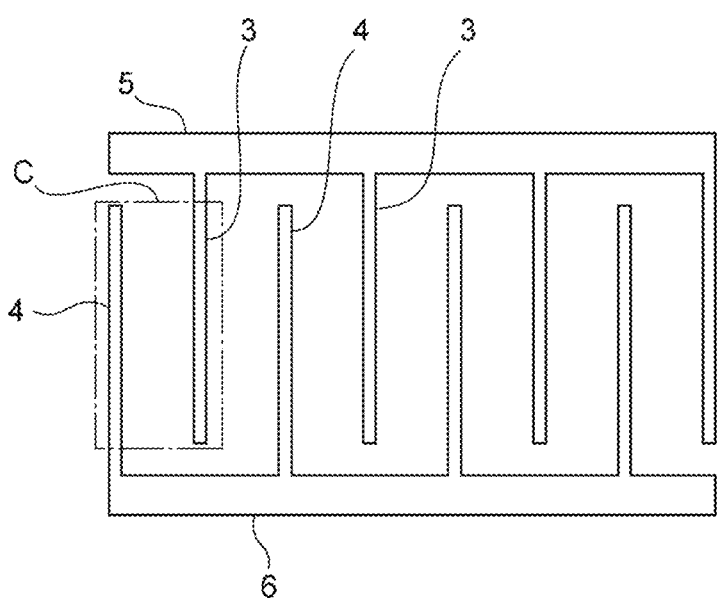
FIG. 17B is plan view illustrating an electrode structure on a piezoelectric layer.
Figure 18:
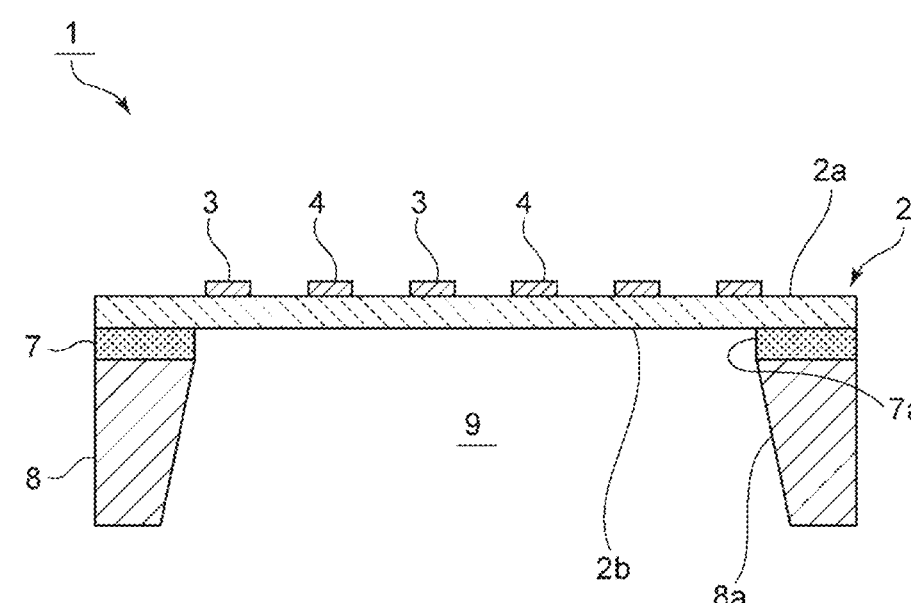
FIG. 18 is a sectional view taken along line A-A in FIG. 17A.

FIG. 17A is a schematic external perspective view of an acoustic wave device that uses a thickness-shear-mode bulk wave, FIG. 17B is a plan view illustrating an electrode structure on a piezoelectric layer, and FIG. 18 is a cross-sectional view taken along line A-A in FIG. 17A.

An acoustic wave device 1 includes a piezoelectric layer 2 made of, for example, LiNbO₃. The piezoelectric layer 2 may be made of, for example, LiTaO₃. Although the cut angle of LiNbO₃ and LiTaO₃ is Z-cut, the cut angle may be rotational Y-cut or X-cut. Although the thickness of the piezoelectric layer 2 is not particularly limited, in order to effectively excite a thickness shear mode, for example, it is preferable that the thickness is greater than or equal to about 40 nm and less than or equal to about 1000 nm, and it is preferable that the thickness be greater than or equal to about 50 nm and less than or equal to about 1000 nm. The piezoelectric layer 2 includes first and second main surfaces 2a and 2b that face each other. An electrode 3 and an electrode 4 are provided on the first main surface 2a. Here, the electrode 3 is an example of a "first electrode", and the electrode 4 is an example of a "second electrode". In FIGS. 17A and 17B, a plurality of electrodes 3 are a plurality of first electrode fingers that are connected to a first busbar 5. A plurality of electrodes 4 are a plurality of second electrode fingers that are connected to a second busbar 6. The plurality of electrodes 3 and the plurality of electrodes 4 are interdigitated with each other. The electrodes 3 and the electrodes 4 each have a rectangular or substantially rectangular shape and a length direction. Each of the electrodes 3 and an adjacent one of the electrodes 4 face each other in a direction perpendicular or substantially perpendicular to the length direction. The length direction of the electrodes 3 and 4 and the direction perpendicular or substantially perpendicular to the length direction of the electrodes 3 and 4 are each a direction that crosses the thickness direction of the piezoelectric layer 2. Therefore, it can be said that the electrode 3 and the adjacent electrode 4 face each other in a direction that crosses the thickness direction of the piezoelectric layer 2. The length direction of the electrodes 3 and 4 may be interchanged with a direction perpendicular or substantially perpendicular to the length direction of the electrodes 3 and 4 illustrated in FIGS. 17A and 17B. That is, the electrodes 3 and 4 may be extended in a direction in which the first busbar 5 and the second busbar 6 extend in FIGS. 17A and 17B. In this case, the first busbar 5 and the second busbar 6 extend in the direction in which the electrodes 3 and 4 extend in FIGS. 17A and 17B. A plurality of pairs of structures in each of which the electrode 3 connected to one potential and the electrode 4 connected to the other potential are adjacent to each other are provided in the direction perpendicular or substantially perpendicular to the length direction of the electrodes 3 and 4. Here, "the electrode 3 and the electrode 4 are adjacent to each other" does not refer to a case where the electrode 3 and the electrode 4 are disposed in direct contact with each other but refers to a case where the electrode 3 and the electrode 4 are disposed with a space therebetween. In the case where the electrode 3 and the electrode 4 are adjacent to each other, an electrode connected to a hot electrode or a ground electrode, including other electrodes 3 and 4, is not disposed between the electrode 3 and the electrode 4. The number of pairs need not be an integer, and may be 1.5 pairs, 2.5 pairs, or the like. It is preferable that the center-to-center distance between the electrodes 3 and 4, that is, the pitch is, for example, in the range of greater than or equal to about 1 μm and less than or equal to about 10 μm. It is preferable that the width of the electrodes 3 and 4, that is, the dimension of the electrodes 3 and 4 in the facing direction is, for example, in the range of greater than or equal to about 50 nm and less than or equal to about 1000 nm, and it is more preferable that the width be in the range of greater than or equal to about 150 nm and less than or equal to about 1000 nm. The "center-to-center distance between the electrodes 3 and 4" is the distance between the center of the dimension (width dimension) of the electrode 3 in the direction perpendicular or substantially perpendicular to the length direction of the electrode 3 and the center of the dimension (width dimension) of the electrode 4 in the direction perpendicular or substantially perpendicular to the length direction of the electrode 4.

Since a Z-cut piezoelectric layer is used in the acoustic wave device 1, the direction perpendicular or substantially perpendicular to the length direction of the electrodes 3 and 4 is the direction perpendicular or substantially perpendicular to the polarization direction of the piezoelectric layer 2.

This does not apply to a case where a piezoelectric body having another cut angle is used as the piezoelectric layer 2. Here, "perpendicular" is not limited to a case of being strictly perpendicular, and may be substantially perpendicular (such that the angle between the direction that is perpendicular to the length direction of the electrodes 3 and 4 and the polarization direction is in the range of, for example, about 90°±10°).

A support 8 is stacked on the second main surface 2b side of the piezoelectric layer 2 with an insulating layer 7 therebetween. The insulating layer 7 and the support 8 have frame shapes and include through-holes 7a and 8a as illustrated in FIG. 18. Thus, a cavity portion 9 is provided. The cavity portion 9 is provided so as not to hinder the vibration of an excitation region C of the piezoelectric layer 2. Accordingly, the support 8 is stacked on the second main surface 2b with the insulating layer 7 therebetween at a position that does not overlap a portion where at least one pair of electrodes 3 and 4 are provided. The insulating layer 7 need not be provided. Accordingly, the support 8 can be directly or indirectly stacked on the second main surface 2b of the piezoelectric layer 2.

The insulating layer 7 is made of, for example, silicon oxide. However, instead of silicon oxide, it is possible to use any appropriate insulating material such as, for example, silicon oxynitride, alumina, or the like. The support 8 is made of, for example, Si. The plane orientation of Si in a surface on the piezoelectric layer 2 side may be (100), (110), or (111). It is preferable that Si of the support 8 have a high resistivity that is, for example, higher than or equal to about 4 kΩ cm. However, the support 8 may also be made of any appropriate insulating material or semiconductor material.

As the material of the support 8, it is possible to use, for example, any of the following: a piezoelectric material such as aluminum oxide, lithium tantalate, lithium niobate, or quartz; ceramics such as alumina, magnesia, sapphire, silicon nitride, aluminum nitride, silicon carbide, zirconia, cordierite, mullite, steatite, or forsterite; a dielectric such as diamond or glass; a semiconductor such as gallium nitride; or the like.

The plurality of electrodes 3 and 4 and the first and second busbars 5 and 6 are each made of an appropriate metal or alloy such as, for example, Al, an AlCu alloy, or the like. In the acoustic wave device 1, the electrodes 3 and 4 and the first and second busbars 5 and 6 each have a structure, for example, in which an Al film is stacked on a Ti film. A close-contact layer other than a Ti film may be used.

To drive the acoustic wave device, an alternative-current voltage is applied between the plurality of electrodes 3 and the plurality of electrodes 4. To be more specific, an alternative-current voltage is applied between the first busbar 5 and the second busbar 6. Thus, it is possible to obtain resonance characteristics using a thickness-shear-mode bulk wave excited in the piezoelectric layer 2. Moreover, in the acoustic wave device 1, for example, d/p is less than or equal to about 0.5, where d is the thickness of the piezoelectric layer 2, and p is the center-to-center distance between adjacent electrodes 3 and 4 among the plurality of pairs of electrodes 3 and 4. Therefore, the thickness-shear-mode bulk wave is effectively excited and it is possible to obtain good resonance characteristics. More preferably, for example, d/p is less than equal to about 0.24, and, in this case, it is possible to obtain better resonance characteristics.

With the acoustic wave device 1, due to the above configuration, a decrease of the Q-value does not easily occur even when the number of pairs of the electrodes 3 and 4 is reduced to achieve reduction in size.

Figure 19A:
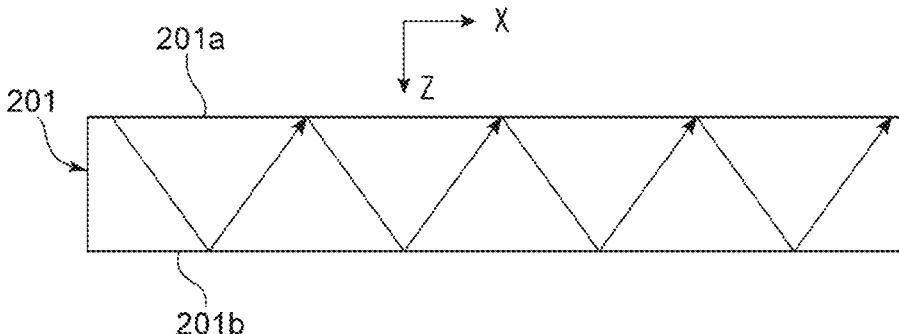
FIG. 19A is a schematic elevational cross-sectional view illustrating a Lamb wave that propagates in a piezoelectric film of an acoustic wave device.
Figure 19B:
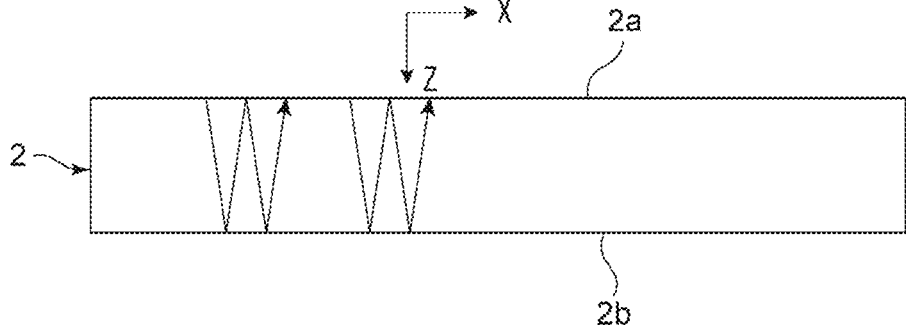
FIG. 19B is a schematic elevational cross-sectional view illustrating a thickness-shear-mode bulk wave that propagates in a piezoelectric film of an acoustic wave device.

This is because propagation loss is small even when the number of electrode fingers in reflectors on both sides is reduced. Moreover, the number of the electrode fingers can be reduced because a thickness-shear-mode bulk wave is used. Referring to FIGS. 19A and 19B, the difference between a Lamb wave used in the acoustic wave device and the thickness-shear-mode bulk wave will be described.

FIG. 19A is a schematic elevational cross-sectional view illustrating a Lamb wave that propagates in a piezoelectric film of an acoustic wave device, such as the one described in Japanese Unexamined Patent Application Publication No. 2012-257019. Here, the wave propagates in a piezoelectric film 201 as indicated by arrows. Here, in the piezoelectric film 201, a first main surface 201a and a second main surface 201b face each other, and the thickness direction connecting the first main surface 201a and the second main surface 201b is the Z direction. The X direction is the direction in which electrode fingers of an IDT electrode are arranged. As illustrated in FIG. 19A, the Lamb wave propagates in the X direction. Although the piezoelectric film 201 vibrates as its entirety since the Lamb wave is a plate wave, since the wave propagates in the X direction, resonance characteristics are obtained by disposing reflectors on both sides. Therefore, wave propagation loss occurs, and the Q-value decreases when reduction in size is intended, that is, the number of pairs of electrode fingers is reduced.

In contrast, as illustrated in FIG. 19B, in the acoustic wave device 1, since vibrational displacement is in the thickness-shear direction, a wave propagates substantially in a direction connecting the first main surface 2a and the second main surface 2b of the piezoelectric layer 2, that is, the Z direction, and resonates. That is, the X-direction component of the wave is considerably small compared with the Z-direction component. Since resonance characteristics are obtained due to the propagation of the wave in the Z direction, even when the number of electrode fingers of the reflector is reduced, propagation loss does not easily occur. Moreover, even when the number of pairs of the electrodes 3 and 4 is reduced to promote reduction in size, decrease of the Q-value does not easily occur.

Figure 20:
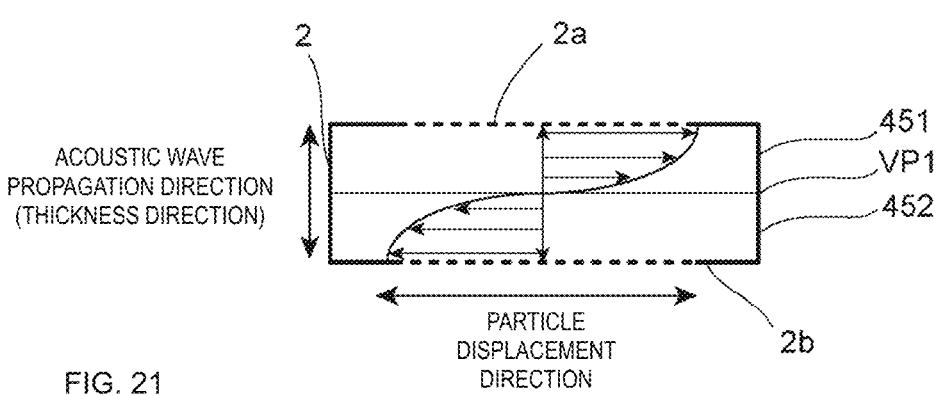
FIG. 20 illustrates the amplitude direction of a thickness-shear-mode bulk wave.

As illustrated in FIG. 20, the amplitude direction of a thickness-shear-mode bulk wave in a first region 451 included in the excitation region C of the piezoelectric layer 2 is opposite to that in a second region 452 included in the excitation region C. FIG. 20 schematically illustrates a bulk wave when a voltage such that the potential of the electrode 4 is higher than that of the electrode 3 is applied between the electrode 3 and the electrode 4. The first region 451 is a region that is included in the excitation region C and located between the first main surface 2a and a virtual plane VP1 that is perpendicular to the thickness direction of the piezoelectric layer 2 and bisects the piezoelectric layer 2. The second region 452 is a region that is included in the excitation region C and located between the second main surface 2b and the virtual plane VP1.

As described above, in the acoustic wave device 1, at least one pair of electrodes including the electrode 3 and the electrode 4 are disposed. However, since a wave need not propagate in the X direction, the number of pairs of the electrodes 3 and 4 need not be plural. That is, it is sufficient that at least one pair of electrodes be provided.

For example, the electrode 3 is an electrode connected to a hot potential, and the electrode 4 is an electrode connected to a ground potential. However, the electrode 3 may be connected to the ground potential, and the electrode 4 may be connected to the hot potential. In the acoustic wave device 1, as described above, at least one pair of electrodes are an electrode connected to the hot potential or an electrode connected to the ground potential, and a floating electrode is not provided.

Figure 21:
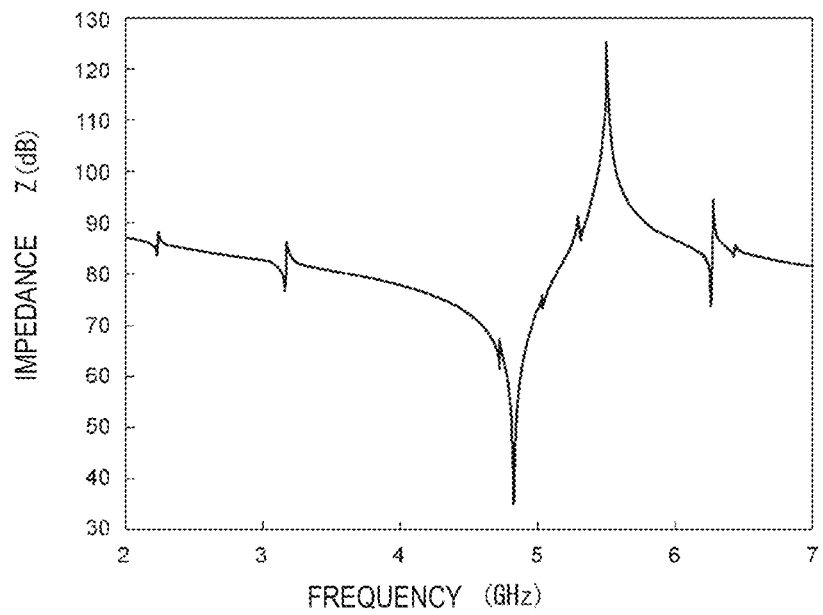
FIG. 21 is a graph illustrating the resonance characteristics of an acoustic wave device that uses a thickness-shear-mode bulk wave.

FIG. 21 is a graph illustrating the resonance characteristics of the acoustic wave device illustrated in FIG. 18. The design parameters of the acoustic wave device 1 having the resonance characteristics are as follows.

piezoelectric layer 2: LiNbO$_3$ having Euler angles (0°, 0°, 90°), thickness=about 400 nm.

The length of a region in which the electrode 3 and the electrode 4 overlap when seen in the direction perpendicular to the length direction of the electrode 3 and the electrode 4, that is, the length of the excitation region C=about 40 μm, the number of pairs of electrodes composed of the electrodes 3 and 4=21 pairs, the center-to-center distance between the electrodes=about 3 μm, the width of the electrodes 3 and 4=about 500 nm, d/p=about 0.133.

insulating layer 7: a silicon oxide film having a thickness of about 1 μm.

support 8: Si.

The "length of the excitation region C" is the dimension of the excitation region C in the length direction of the electrodes 3 and 4.

In the acoustic wave device 1, the electrode-to-electrode distance of an electrode pair including the electrodes 3 and 4 is equal or substantially equal in all pairs. That is, the electrodes 3 and the electrodes 4 are arranged at a regular pitch.

As can be clearly seen from FIG. 21, even without a reflector, good resonance characteristics having a fractional bandwidth of about 12.5% are obtained.

Figure 22:
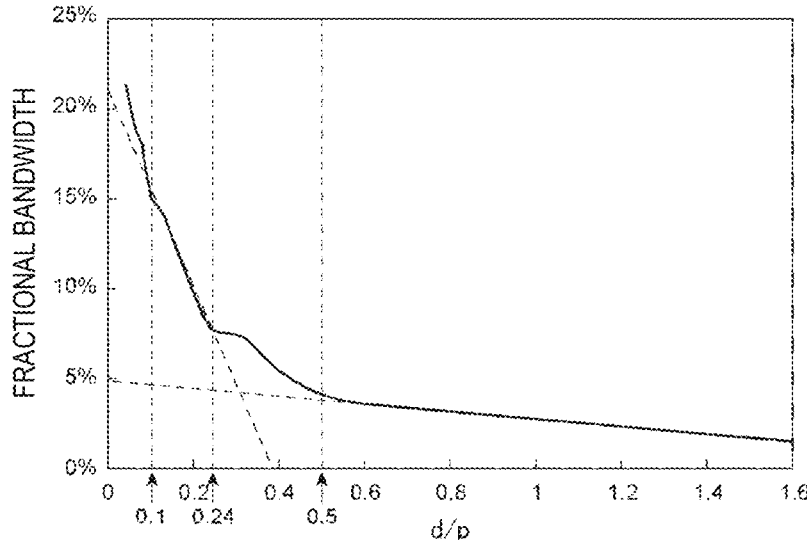
FIG. 22 is a graph illustrating the relationship between d/p and the fractional bandwidth as a resonator, where p is the center-to-center distance between adjacent electrodes and d is the thickness of a piezoelectric layer.

As described above, for example, in the acoustic wave device 1, d/p is less than or equal to about 0.5 and more preferably less than or equal to about 0.24, where d is the thickness of the piezoelectric layer 2 and p is the center-to-center distance between the electrode 3 and the electrode 4. Referring to FIG. 22, this will be described.

A plurality of acoustic wave devices similar to the acoustic wave device having the resonance characteristics illustrated in FIG. 21 are obtained, except that d/p is changed. FIG. 22 is a graph illustrating the relationship between d/p and the fractional bandwidth of an acoustic wave device as a resonator.

As can be clearly seen from FIG. 22, when d/p> about 0.5, even if d/p is adjusted, the fractional bandwidth is less than about 5%. In contrast, when d/p≤about 0.5, by changing d/p in this range, it is possible to make the fractional bandwidth greater than or equal to about 5%, that is, it is possible to configure a resonator having a high coupling coefficient. Moreover, when d/p is less than or equal to about 0.24, it is possible to increase the fractional bandwidth to greater than or equal to about 7%. In addition, by adjusting d/p in this range, it is possible to obtain a resonator having a wider fractional bandwidth and it is possible to obtain a resonator having a higher coupling coefficient. Accordingly, for example, it can be seen that, by making d/p less than or equal to about 0.5, it is possible to configure a resonator that uses a thickness-shear-mode bulk wave and has a high coupling coefficient.

Figure 23:
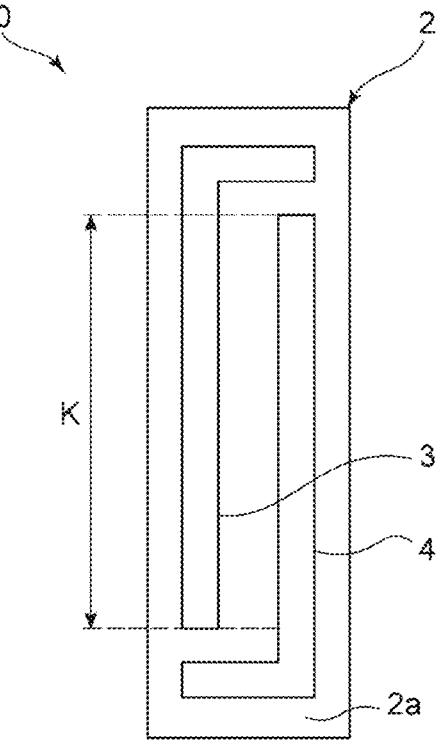
FIG. 23 is plan view of an acoustic wave device that uses a thickness-shear-mode bulk wave.

FIG. 23 is a plan view of an acoustic wave device that uses a thickness-shear-mode bulk wave. In an acoustic wave device 80, a pair of electrodes including the electrode 3 and the electrode 4 are provided on the first main surface 2a of the piezoelectric layer 2. K in FIG. 23 is the crossing width. As described above, in an acoustic wave device according to the present invention, the number of pairs of electrodes may be one pair. Also in this case, when d/p is less than or equal to about 0.5, it is possible to effectively excite a thickness-shear-mode bulk wave.

Figure 24:
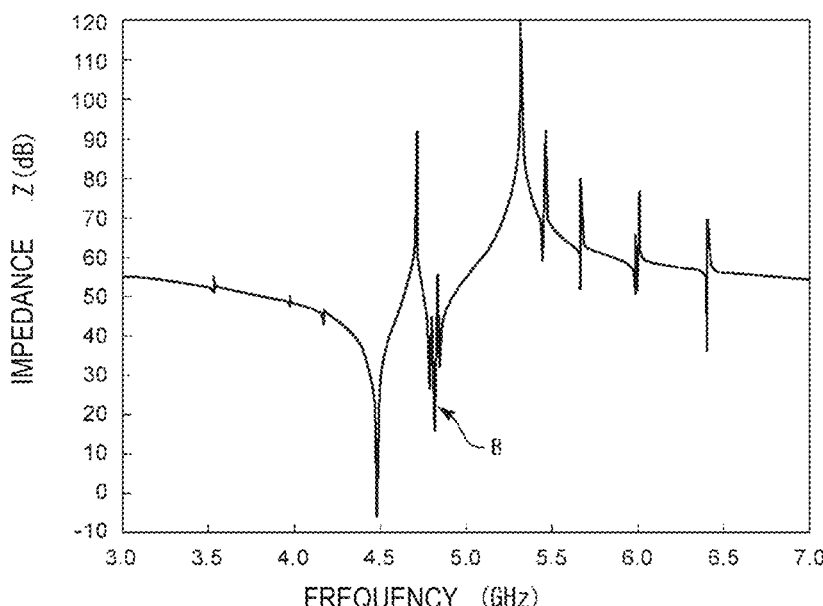
FIG. 24 is a graph illustrating the resonance characteristics of an acoustic wave device according to a reference example in which a spurious response is generated.
Figure 25:
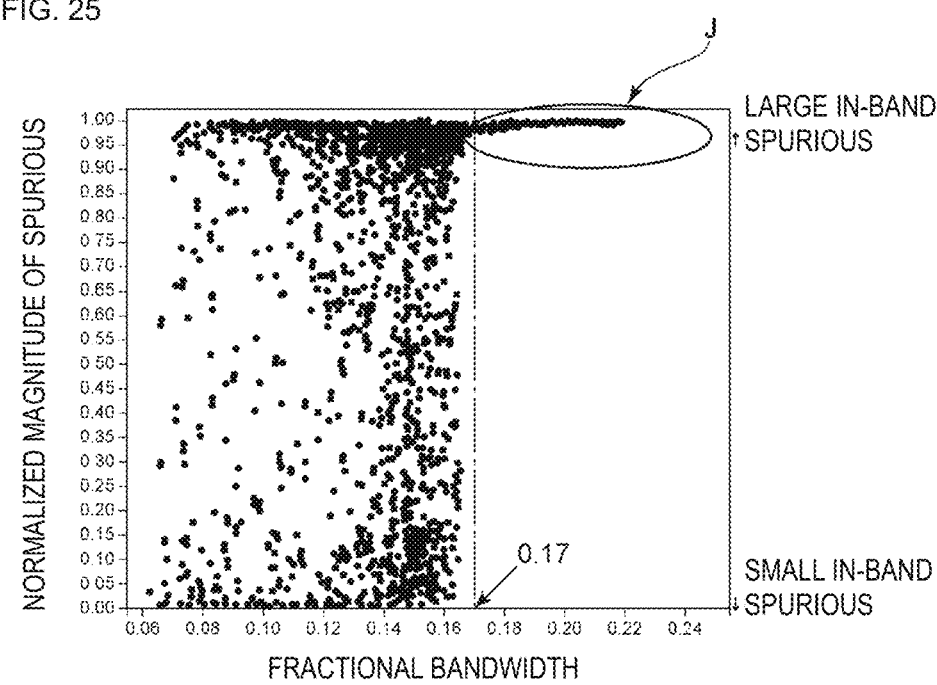
FIG. 25 is a graph illustrating the relationship between the fractional bandwidth and the phase rotation amount of the impedance of a spurious response normalized with about 180 degrees as the magnitude of the spurious response.

In the acoustic wave device 1, for example, preferably, MR≤about 1.75(d/p)+0.075 is satisfied, where MR is the metallization ratio of the adjacent electrodes 3 and 4, among the plurality of electrodes 3 and 4, with respect to the excitation region C, which is a region that the adjacent electrodes 3 and 4 overlap when seen in a direction in which the adjacent electrodes 3 and 4 face each other. In this case, it is possible to effectively reduce spurious responses. Referring to FIGS. 24 and 25, this will be described. FIG. 24 is a reference graph illustrating an example of the resonance characteristics of the acoustic wave device 1. A spurious response indicated by an arrow B is generated between the resonant frequency and the anti-resonant frequency. d/p=about 0.08, and Euler angles of LiNbO$_3$ are (0°, 0°, 90°). The metallization ratio MR=about 0.35.

Referring to FIG. 17B, the metallization ratio MR will be described. It is assumed that, when one pair of electrodes 3 and 4 are focused, only this pair of electrodes 3 and 4 are provided in the electrode structure illustrated in FIG. 17B. In this case, a portion surrounded by an alternate long and short dash line is the excitation region C. This "excitation region C" is a region of the electrode 3 that overlaps the electrode 4 when the electrode 3 and the electrode 4 are seen in the direction perpendicular or substantially perpendicular to the length direction of the electrodes 3 and 4, that is, the facing direction, a region of the electrode 4 that overlaps the electrode 3, and a region that is located between the electrode 3 and the electrode 4 and where the electrode 3 and the electrode 4 overlap each other. Then, the metallization ratio MR is the ratio of the area of the excitation region C to the area of the electrodes 3 and 4 in the excitation region C. That is, the metallization ratio MR is the ratio of the area of a metallization portion to the area of the excitation region C.

When a plurality of pairs of electrodes are provided, MR may be defined as the ratio of metallization portions included in all excitation regions to the sum of the areas of the excitation regions.

FIG. 25 is a graph illustrating the relationship between the fractional bandwidth and the phase rotation amount of the impedance of a spurious response normalized with about 180 degrees as the magnitude of spurious response, when a large number of acoustic wave resonators are configured in accordance with the configuration of the acoustic wave device 1. The fractional bandwidth is adjusted by changing the film thickness of the piezoelectric layer and the dimensions of electrodes in various ways. Although the results shown in FIG. 25 are those when a piezoelectric layer made of Z-cut LiNbO$_3$ is used, similar results are obtained when a piezoelectric layer having another cut angle is used.

A spurious response is as large as about 1.0 in a region surrounded by an ellipse J in FIG. 25. As can be clearly seen from FIG. 25, when the fractional bandwidth exceeds about 0.17, that is, exceeds about 17%, a large spurious response of a spurious level of about 1 or greater is generated in a pass band, even when parameters of the fractional bandwidth are changed. That is, as in the resonance characteristics illustrated in FIG. 24, a large spurious response indicated by the arrow B is generated in the band. Thus, for example, it is preferable that the fractional bandwidth be less than or equal to about 17%. In this case, it is possible to reduce spurious responses by adjusting the film thickness of the piezoelectric layer 2, the dimensions of the electrodes 3 and 4, and the like.

Figure 26:
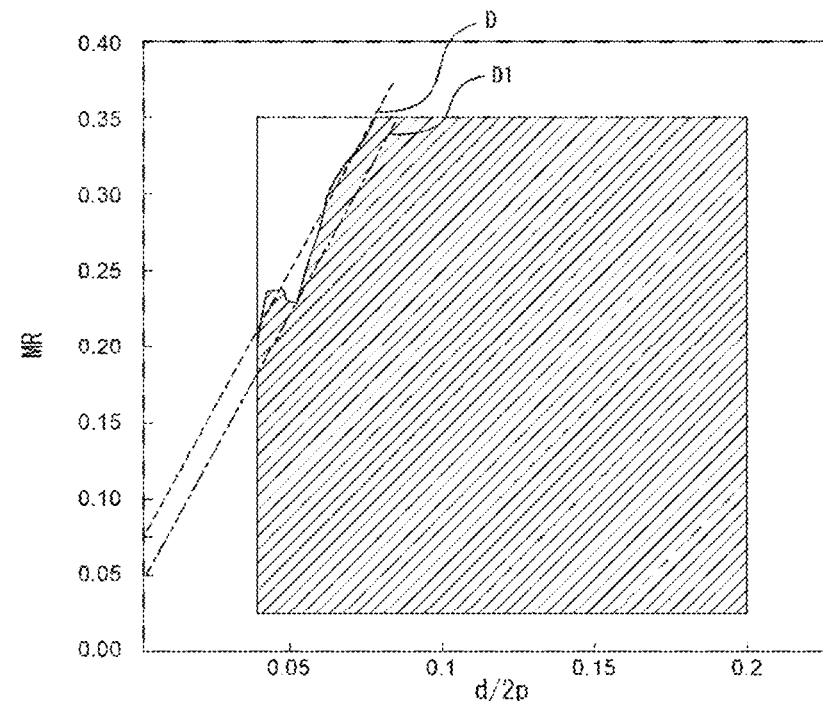
FIG. 26 is a graph illustrating the relationship between d/2p and the metallization ratio MR.

FIG. 26 is a graph illustrating the relationship among d/2p, the metallization ratio MR, and the fractional bandwidth. Regarding the acoustic wave device described above, various acoustic wave devices that differ in d/2p and MR are configured, and the fractional bandwidth is measured. The hatched region in FIG. 26 on the right side of a broken line D is a region in which the fractional bandwidth is less than or equal to about 17%. The boundary between the hatched region and the unhatched region is represented by MR=about 3.5 (d/2p)+0.075. That is, MR=about 1.75(d/p)+0.075. Accordingly, for example, preferably, MR≤about 1.75(d/p)+0.075. In this case, it is easy to make the fractional bandwidth less than or equal to about 17%. A region on the right side of MR=about 3.5(d/2p)+0.05, which is represented by an alternate long and short dash line D1 in FIG. 26, is more preferable. That is, when MR about 1.75(d/p)+0.05, it is possible to reliably make the fractional bandwidth less than or equal to about 17%.

Figure 27:
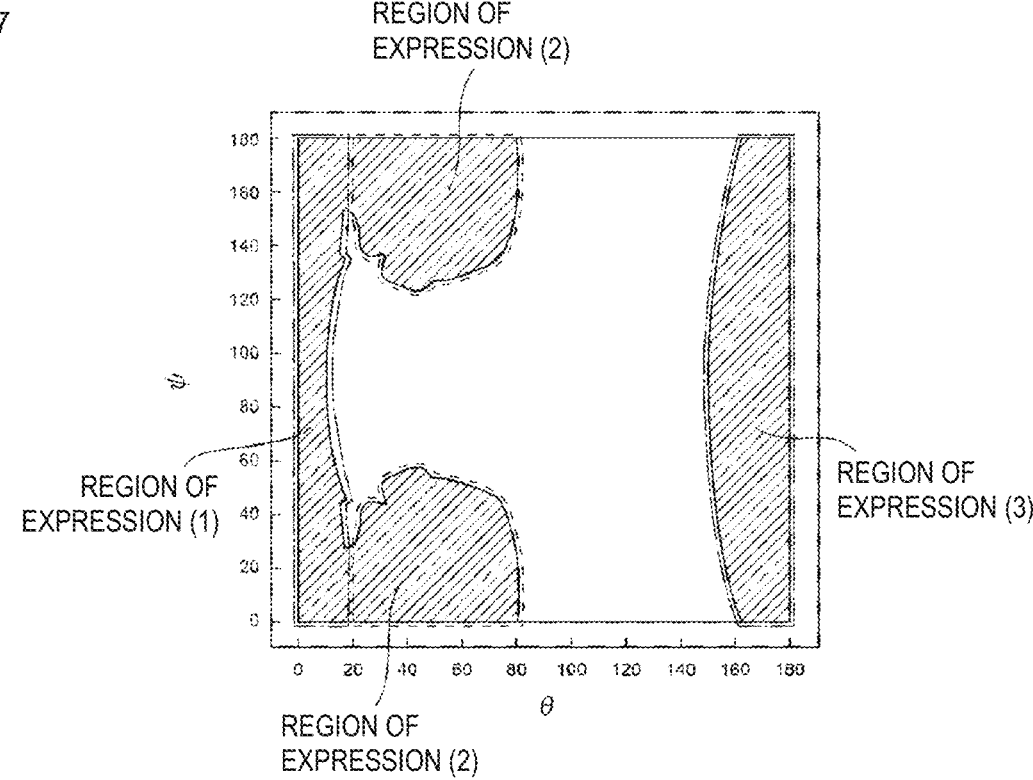
FIG. 27 illustrates a map of the fractional bandwidth with respect to the Euler angles $(0°, θ, ψ)$ of $LiNbO_3$ when d/p is infinitely close to 0.

FIG. 27 illustrates a map of the fractional bandwidth with respect to the Euler angles $(0°, \theta, \psi)$ of $LiNbO_3$ when d/p is made infinitely close to 0. The hatched portion in FIG. 27 is a region in which a fractional bandwidth of at least about 5% or greater is obtained, and the range of the region is approximately a range represented by the following expressions (1), (2), and (3).

$$(0° \pm 10°, 0° \text{ to } 20°, \text{any } \psi) \quad \text{expression (1)}$$

$$\left(0° \pm 10°, 20° \text{ to } 80°, 0° \text{ to } 60°\left(1-(\theta-50)^2/900\right)^{1/2}\right) \text{ or} \quad \text{expression (2)}$$

$$\left(0° \pm 10°, 20° \text{ to } 80°, \left[180° - 60°\left(1-(\theta-50)^2/900\right)^{1/2}\right] \text{ to } 180°\right)$$

$$\left(0° \pm 10°, \left[180° - 30°\left(1-(\psi-90)^2/8100\right)^{1/2}\right] \text{ to } 180°, \text{any } \psi\right) \text{expression (3)}$$

Accordingly, the Euler angle range of the expression (1) (2), or (3), with which the fractional bandwidth can be made sufficiently wide, is preferable. The same applies to a case where the piezoelectric layer 2 is a lithium tantalate layer.

As described above, in the acoustic wave devices according to the first to fourth example embodiments and the modifications, for example, each of which uses a thickness-shear-mode bulk wave, it is preferable that d/p be less than or equal to about 0.5, and it is more preferable that d/p be less than or equal to about 0.24. Thus, it is possible to obtain better resonance characteristics. Moreover, as described above, in the excitation region of the acoustic wave devices according to the first to fourth example embodiments and the modifications, each of which uses a thickness-shear-mode bulk wave, for example, it is preferable that MR≤about 1.75(d/p)+0.075 is satisfied. In this case, it is possible to more reliably reduce or prevent spurious responses.

It is preferable that the piezoelectric layer in the acoustic wave devices according to the first to fourth example embodiments and the modifications, each of which uses a thickness-shear-mode bulk wave, is, for example, a lithium niobate layer or a lithium tantalate layer. It is preferable that the Euler angles $(\phi, \theta, \sigma)$ of lithium niobate or lithium tantalate of the piezoelectric layer be in the range of the above expression (1), (2), or (3). In this case, it is possible to make the fractional bandwidth sufficiently wide.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric substrate including a support including a support substrate and a piezoelectric layer on the support and made of lithium tantalate or lithium niobate; and an interdigital transducer (IDT) electrode on the piezoelectric layer and including a pair of busbars and a plurality of electrode fingers; wherein d/p is less than or equal to about 0.5, where d is a thickness of the piezoelectric layer and p is a center-to-center distance between the plurality of electrode fingers that are adjacent to each other;

some electrode fingers of the plurality of electrode fingers are connected to one of the pair of busbars, remaining electrode fingers of the plurality of electrode fingers are connected to another of the pair of busbars, and the some electrode fingers connected to the one of the busbars and the remaining electrode fingers connected to the another busbar are interdigitated with each other;

when seen from an electrode-finger-facing direction in which adjacent electrode fingers of the plurality of electrode fingers face each other, a region in which the adjacent electrode fingers overlap each other is a crossing region, regions between the crossing region and the pair of busbars are a pair of gap regions, and the crossing region includes a central region and a pair of edge regions provided with the central region therebetween in an electrode-finger-extending direction in which the plurality of electrode fingers extend;

the support includes a support portion supporting the piezoelectric layer and a non-support portion not supporting the piezoelectric layer;

the non-support portion of the support overlaps, in plan view, the central region and about 90% or more of a portion of the pair of edge regions located between the plurality of electrode fingers;

when seen in plan view, a through-hole is provided in the piezoelectric layer in about 50% or more of a portion overlapping the pair of gap regions and located between the plurality of electrode fingers; and in plan view, the support portion of the support overlaps a portion of the pair of gap regions where the plurality of electrode fingers are provided.

2. The acoustic wave device according to claim 1, wherein the non-support portion of the support overlaps, in plan view, all of the portion of the pair of edge regions that is located between the plurality of electrode fingers.

3. The acoustic wave device according to claim 2, wherein the non-support portion overlaps an entirety or substantially an entirety of the pair of edge regions in plan view.

4. The acoustic wave device according to claim 1, wherein the support includes the support portion at at least one position overlapping, in plan view, a portion of the edge regions where the plurality of electrode fingers are provided.

5. The acoustic wave device according to claim 4, wherein the support portion at at least one position extends from the support portion overlapping the portion of the gap regions where the plurality of electrode fingers are provided in plan view.

6. The acoustic wave device according to claim 4, wherein the support portion at at least one position overlaps, in plan view, a portion of the edge regions where end portions of the plurality of electrode fingers are provided.

7. The acoustic wave device according to claim 1, wherein the through-hole of the piezoelectric layer is provided in an entirety or substantially an entirety of a portion that overlaps the pair of gap regions when seen in plan view and that is located between the plurality of electrode fingers.

8. The acoustic wave device according to claim 1, wherein a hole portion integrated with the through-hole of the piezoelectric layer is provided in the support; and the hole portion and the non-support portion of the support communicate with each other.

9. The acoustic wave device according to claim 8, wherein the hole portion of the support is a recessed portion.

10. The acoustic wave device according to claim 1, wherein the support includes an insulating layer on the support substrate; and the piezoelectric layer is on the insulating layer.

11. The acoustic wave device according to claim 10, wherein the insulating layer includes silicon oxide or tantalum oxide.

12. The acoustic wave device according to claim 1, wherein d/p is less than or equal to about 0.24.

13. The acoustic wave device according to claim 1, wherein MR≤about 1.75 (d/p)+0.075 is satisfied, where MR is a metallization ratio of the plurality of electrode fingers with respect to an excitation region, the excitation region being a region where the plurality of electrode fingers that are adjacent to each other overlap each other when seen from a direction in which the plurality of electrode fingers that are adjacent to each other face each other and that is between centers of the plurality of electrode fingers that are adjacent to each other.

14. The acoustic wave device according to claim 1, wherein Euler angles ($\varphi$, $\theta$, $\psi$) of lithium niobate or lithium tantalate included in the piezoelectric layer are in a range of expression (1), (2), or (3):

$$(0° \pm 10°, 0° \text{ to } 20°, \text{any } \psi); \qquad \text{expression (1)}$$

$$\left(0° \pm 10°, 20° \text{ to } 80°, 0° \text{ to } 60°\left(1 - (\theta - 50)^2 / 900\right)^{1/2}\right) \qquad \text{expression (2)}$$

$$\text{or } \left(0° \pm 10°, 20° \text{ to } 80°,\right.$$

$$\left.\left[180° - 60°\left(1 - (\theta - 50)^2 / 900\right)^{1/2}\right] \text{ to } 180°\right); \text{ and}$$

$$\left(0° \pm 10°, \left[180° - 30°\left(1 - (\psi - 90)^2 / 8100\right)^{1/2}\right] \text{ to } 180°,\right. \qquad \text{expression (3)}$$

$$\left. \text{any } \psi\right).$$

15. The acoustic wave device according to claim 1, wherein the support includes at least one of silicon or aluminum oxide.

16. The acoustic wave device according to claim 1, wherein a dielectric film is provided on the piezoelectric layer and covering the IDT electrode.

17. The acoustic wave device according to claim 16, wherein the dielectric film includes silicon oxide, silicon nitride, or silicon oxynitride.

18. The acoustic wave device according to claim 1, wherein the support includes Si with a resistivity higher than or equal to about 4 kΩ cm.

19. The acoustic wave device according to claim 1, wherein the plurality of electrode fingers includes Al or an AlCu alloy.

\* \* \* \* \*